US010615213B2

(12) United States Patent
Cho et al.

(10) Patent No.: US 10,615,213 B2
(45) Date of Patent: Apr. 7, 2020

(54) METHODS OF FORMING REDISTRIBUTION LINES AND METHODS OF MANUFACTURING SEMICONDUCTOR DEVICES USING THE SAME

(71) Applicant: SAMSUNG ELECTRONICS CO., LTD., Suwon-si, Gyeonggi-do (KR)

(72) Inventors: Yonghoe Cho, Bucheon-si (KR); Jongbo Shim, Asan-si (KR); Seunghoon Yeon, Suwon-si (KR); Won Il Lee, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 32 days.

(21) Appl. No.: 15/996,480

(22) Filed: Jun. 3, 2018

(65) Prior Publication Data

US 2019/0172865 A1 Jun. 6, 2019

(30) Foreign Application Priority Data

Dec. 6, 2017 (KR) ........................ 10-2017-0166859

(51) Int. Cl.
*H01L 21/00* (2006.01)
*H01L 27/146* (2006.01)

(52) U.S. Cl.
CPC .... *H01L 27/14636* (2013.01); *H01L 27/1462* (2013.01); *H01L 27/14685* (2013.01); *H01L 27/14687* (2013.01); *H01L 27/14689* (2013.01); *H01L 27/1463* (2013.01); *H01L 27/14621* (2013.01); *H01L 27/14627* (2013.01); *H01L 27/14645* (2013.01)

(58) Field of Classification Search
CPC .......... H01L 27/14636; H01L 27/1462; H01L 27/14685; H01L 27/14687; H01L 27/14689; H01L 27/14621; H01L 27/14627; H01L 27/1463; H01L 27/14645
See application file for complete search history.

(56) References Cited

U.S. PATENT DOCUMENTS 6,770,971 B2 8/2004 Kouno et al.
8,212,297 B1 * 7/2012 Law .................. H01L 27/14618
257/292
8,916,972 B2 12/2014 Lin et al.
(Continued)

FOREIGN PATENT DOCUMENTS

JP 2009-0182263 A 8/2009
JP 2014127649 A 7/2014
JP 2017-092152 A 5/2017

*Primary Examiner* — Richard A Booth
(74) *Attorney, Agent, or Firm* — Volentine, Whitt & Francos, PLLC

(57) ABSTRACT

A method of manufacturing a semiconductor device includes providing a semiconductor substrate having a top surface, on which has been formed a color filter and a micro-lens, and a bottom surface opposite to the top surface, forming a redistribution line on the bottom surface of the semiconductor substrate, and forming on the bottom surface of the semiconductor substrate a passivation layer covering the redistribution line. After the redistribution line and passivation layer are formed, an oxide layer between the redistribution line and the passivation is formed at a temperature that avoids thermal damage to the color filter and the micro-lens.

23 Claims, 19 Drawing Sheets

(56) References Cited

U.S. PATENT DOCUMENTS

| | | |
|---|---|---|
| 2005/0056903 A1 | 3/2005 | Yamamoto et al. |
| 2006/0043569 A1 | 3/2006 | Benson et al. |
| 2011/0227186 A1* | 9/2011 | Chang ................ H01L 23/481 |
| | | 257/448 |
| 2013/0277785 A1 | 10/2013 | Chen et al. |
| 2014/0027872 A1 | 1/2014 | Yu et al. |
| 2014/0361347 A1* | 12/2014 | Kao ................ H01L 27/14687 |
| | | 257/226 |
| 2016/0240480 A1 | 8/2016 | Lin et al. |
| 2017/0170107 A1 | 6/2017 | Paek et al. |
| 2017/0200664 A1 | 7/2017 | Tsao et al. |
| 2017/0213801 A1 | 7/2017 | Wu et al. |

* cited by examiner

METHODS OF FORMING REDISTRIBUTION LINES AND METHODS OF MANUFACTURING SEMICONDUCTOR DEVICES USING THE SAME

PRIORITY STATEMENT

This U.S. nonprovisional application claims priority under 35 U.S.C § 119 to Korean Patent Application No. 10-2017-0166859 filed on Dec. 6, 2017, in the Korean Intellectual Property Office, the contents of which are hereby incorporated by reference in their entirety.

BACKGROUND

The present inventive concept relates to devices employing semiconductors such as images sensors including photodiodes. In particular, the inventive concept relates to a method of forming redistribution lines in the manufacturing of semiconductor devices.

Redistribution lines of a semiconductor device are conductive lines that distribute various signals throughout the device. The redistribution lines are prone to such problems as oxidation and electrochemical migration of constituent elements that make up the lines, which in turn decreases the reliability of the devices in which they are incorporated.

SUMMARY

According to the present inventive concepts there is provided a method of manufacturing a semiconductor device including providing a base structure including a semiconductor substrate having a top surface and a bottom surface opposite to the top surface, and a color filter and a micro-lens on the top surface of the semiconductor substrate, forming a redistribution line on the bottom surface of the semiconductor substrate, forming a passivation layer covering the redistribution line on the bottom surface of the semiconductor substrate, and spontaneously forming an oxide layer on the redistribution line, and growing the oxide layer between the redistribution line and the passivation layer at a temperature regime specified to avoid thermal damage to the color filter and the micro-lens.

According to the present inventive concept, there is also provided a method of manufacturing a semiconductor device including providing a base structure including semiconductor substrate having an active surface and an inactive surface opposite to the active surface, and a color filter and a micro-lens on the active surface, forming a redistribution metal layer on the inactive surface of the semiconductor substrate, forming on the inactive surface of the semiconductor substrate an organic insulation layer covering the redistribution metal layer; and growing a metal oxide layer to a predetermined thickness between the redistribution metal layer and the organic insulation layer. The metal oxide layer is grown to the predetermined thickness during processing carried out subsequent to the forming of the organic insulation layer within a temperature regime specified to avoid thermal damage to the color filter and the micro-lens.

According to the present inventive concept, there is also provided a method of forming a redistribution line that includes providing a base structure including a semiconductor substrate having an active surface and an inactive surface, and a through electrode that does not reach the inactive surface, recessing the inactive surface of the semiconductor substrate to expose the through electrode, subsequently forming the redistribution line on the inactive surface of the semiconductor substrate, the redistribution line electrically connected to the through electrode, forming an organic passivation layer covering the redistribution line, and growing, at a temperature equal to or less than 250° C., a native metal oxide layer between the redistribution line and the organic passivation layer to a thickness in a range of from 50 nm to 200 nm.

According to the present inventive concept, there is also provided manufacturing a semiconductor device that includes providing a base structure including a semiconductor substrate having top and bottom surfaces facing in opposite directions, a via exposed at the bottom surface, and a color filter and a micro-lens on the top surface of the semiconductor substrate, forming a metallic redistribution line extending along the bottom surface of the semiconductor substrate and onto the via, forming a passivation layer covering the metallic redistribution line, and subsequently completing the manufacturing of the semiconductor device by carrying out processes within a temperature regime whose maximum temperature is less than a temperature rating of each of the color filter and the micro-lens, and in which an oxide layer is grown between the metallic redistribution line and the passivation layer under said temperature regime and has a thickness in a range of from 50 nm to 200 nm when said processes have been completed.

DETAILED DESCRIPTION

Methods of forming a redistribution line and methods of manufacturing semiconductor devices including the same according to inventive concept will be hereinafter described in conjunction with the accompanying drawings.

Figure 1A:
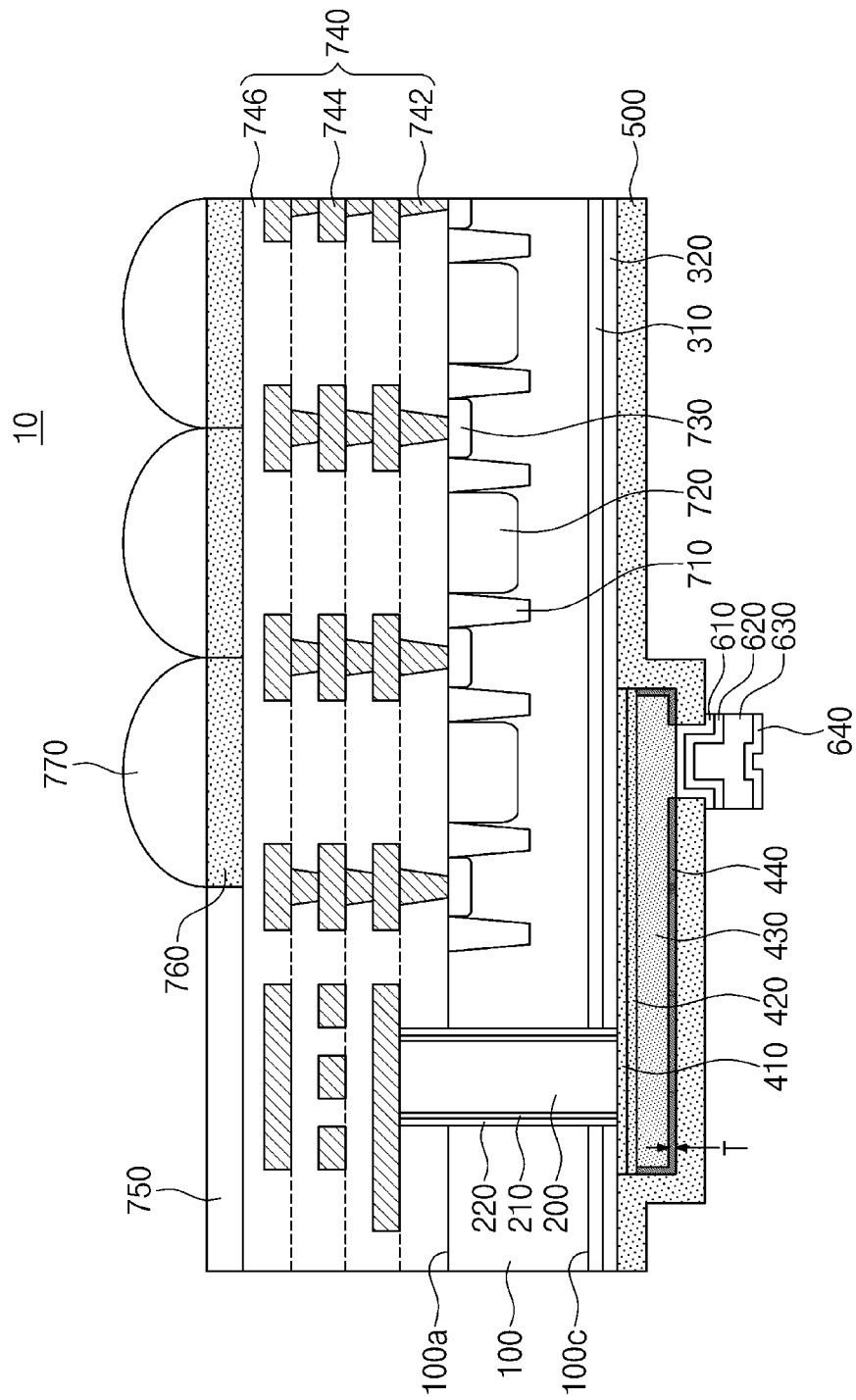
FIG. 1A is a cross-sectional view of an example of a semiconductor device according to the inventive concept.

FIG. 1A illustrates an example of a semiconductor device manufactured according to the inventive concept.

Referring to FIG. 1A, the semiconductor device 10 may include a semiconductor substrate 100 with a top surface 100a and a bottom surface 100c facing each other, a plurality of photodiodes 720 provided in the semiconductor substrate 100 and separated from each other by device isolation layers 710, a metal line structure 740 provided on the top surface 100a of the semiconductor substrate 100, a plurality of color filters 760 provided on the metal line structure 740, and a plurality of micro-lenses 770 corresponding to the color filters 760. The top surface 100a may be an active surface of the semiconductor substrate 100, and the bottom surface 100c may be an inactive surface of the semiconductor substrate 100.

The metal line structure 740 may include a plurality of stacked dielectric layers 746, a plurality of vias 742 electrically connected to a plurality of storage nodes 730 provided in the semiconductor substrate 100, and a plurality of metal lines 744. The metal line structure 740 may be covered with an upper insulation layer 750 having a single-layered or multi-layered structure.

The semiconductor device 10 may further include a through electrode 200 that extends through the semiconductor substrate 100 to come into electrical connection with the metal line structure 740, a redistribution line 430 provided on the bottom surface 100c of the semiconductor substrate 100 and electrically connected to the through electrode 200, and a passivation layer 500 covering the redistribution line 430.

The through electrode 200 may be coupled to a metal line 744 of the metal line structure 740. The through electrode 200 may be electrically insulated through a via insulation layer 220 from the semiconductor substrate 100. A barrier layer 210 may further be included between the though electrode 200 and the via insulation layer 220, preventing a component of constituent element, e.g., copper and referred to hereinafter simply as "constituent" of the through electrode 200 from diffusing into the semiconductor substrate 100.

A first lower insulation layer 310 and a second lower insulation layer 320 may be sequentially stacked on the bottom surface 100c of the semiconductor substrate 100. The first lower insulation layer 310 and the second lower insulation layer 320 may be of different insulating materials from each other. For example, the first lower insulation layer 310 may be a layer of silicon oxide, and the second lower insulation layer 320 may be a layer silicon nitride.

The redistribution line 430 may be provided on the second lower insulation layer 320 and electrically connected to the through electrode 200. The redistribution line 430 may include a metal, such as copper. The redistribution line 430 and the second lower insulation layer 320 may be provided therebetween with a barrier layer 410 coupled to the through electrode 200 and with a seed layer 420 on the barrier layer 410. Alternatively, only one lower insulation layer, i.e., only a mono-layer of an insulating material, may be interposed between the bottom surface 100c of the semiconductor substrate 100 and the redistribution line 430.

In either case, the redistribution line 430 may have a thickness equal to or less than about 15 μm, and preferably from about 10 μm to about 15 μm. Here, and in the description that follows the term "about" is used to refer to minute differences from the design specifications (the enumerated values) as a result of normal tolerances and variations associated with the manufacturing process. Therefore, the ranges given may include the enumerated values.

The passivation layer 500 may be provided on the bottom surface 100c of the semiconductor substrate 100 as covering the redistribution line 430. The passivation layer 500 may comprise (be or include) an inorganic insulation layer or an organic insulation layer. For example, the passivation layer 500 may comprise (be or include) an organic insulation layer, such as polybenzoxazole (PBO). The passivation layer 500 may have a thickness of about 3 μm to about 5 μm.

The redistribution line 430 may be covered with an oxide layer 440. The oxide layer 440 may be or include a spontaneous oxide layer (or a native metal oxide layer) that automatically grows when oxygen in the passivation layer 500 and a constituent (e.g., copper) of the redistribution line 430 are reacted with each other in a subsequent process after the passivation layer 500 is formed. A spontaneous oxide layer will refer to any oxide layer that is (first) formed without any process, e.g., a thermal oxidation or anneal process, dedicated to that end. Spontaneous oxides may form on a solid as a result of the solid being exposed to air (at room temperature) or as a result of the solid coming into contact with another solid containing oxygen.

In an example of the inventive concept, the oxide layer 440 may be grown for several to tens of hours (e.g., less than about 10 hours) at a low temperature regime (e.g., temperatures equal to or less than about 250° C.) that avoids thermal damage to the color filters 760 and/or the micro-lenses 770. In particular, the color filters 760 and the micro-lenses 770 have temperature ratings which are the maximum temperatures that these elements can withstand for a long duration without degrading. The temperatures ratings can therefore be a known quantity or specification based on the specific type of material, e.g., the polymer, from which the color filters 760 and micro-lenses 770 are made. The oxide layer 440 may automatically grow at the low temperature and/or for the short process time, and accordingly has a thickness T of about 50 nm to about 200 nm, and preferably about 100 nm.

An outer terminal 630 may be electrically connected to the redistribution line 430. A barrier layer 610 and a seed layer 620 may be provided between the outer terminal 630 and the redistribution line 430, and a capping layer 640 may be provided on the outer terminal 630. The outer terminal 630 may be in the form of a bump shape. Alternatively, the outer terminal 630 may be a solder ball.

According to some examples of inventive concept, the oxide layer 440 serves as a barrier that prevents migration of a constituent (e.g., copper) of the redistribution line 430. If the thickness T of the oxide layer 440 were less than about 50 nm, a constituent (e.g., copper) of the redistribution line 430 easily migrates. If the thickness T of the oxide layer 440 were greater than about 200 nm, the oxide layer 440 would tend to crack and such a cracked oxide layer 440 could not serve effectively as a barrier against the migration of a constituent (e.g., copper) of the redistribution line 430. Either of these problems could cause an electrical failure of the redistribution line 430 or the semiconductor device 10.

As discussed above, however, according to the inventive concept, the oxide layer 440 is grown at a relatively low temperature and/or for a relatively short time, thereby allowing it to achieve a thickness T of about 50 nm to about 200 nm, and preferably about 100 nm. As a result, the oxide layer 440 may be substantially free of copper or cracks that could otherwise cause an electrical failure of the semiconductor device 10.

Figure 1B:
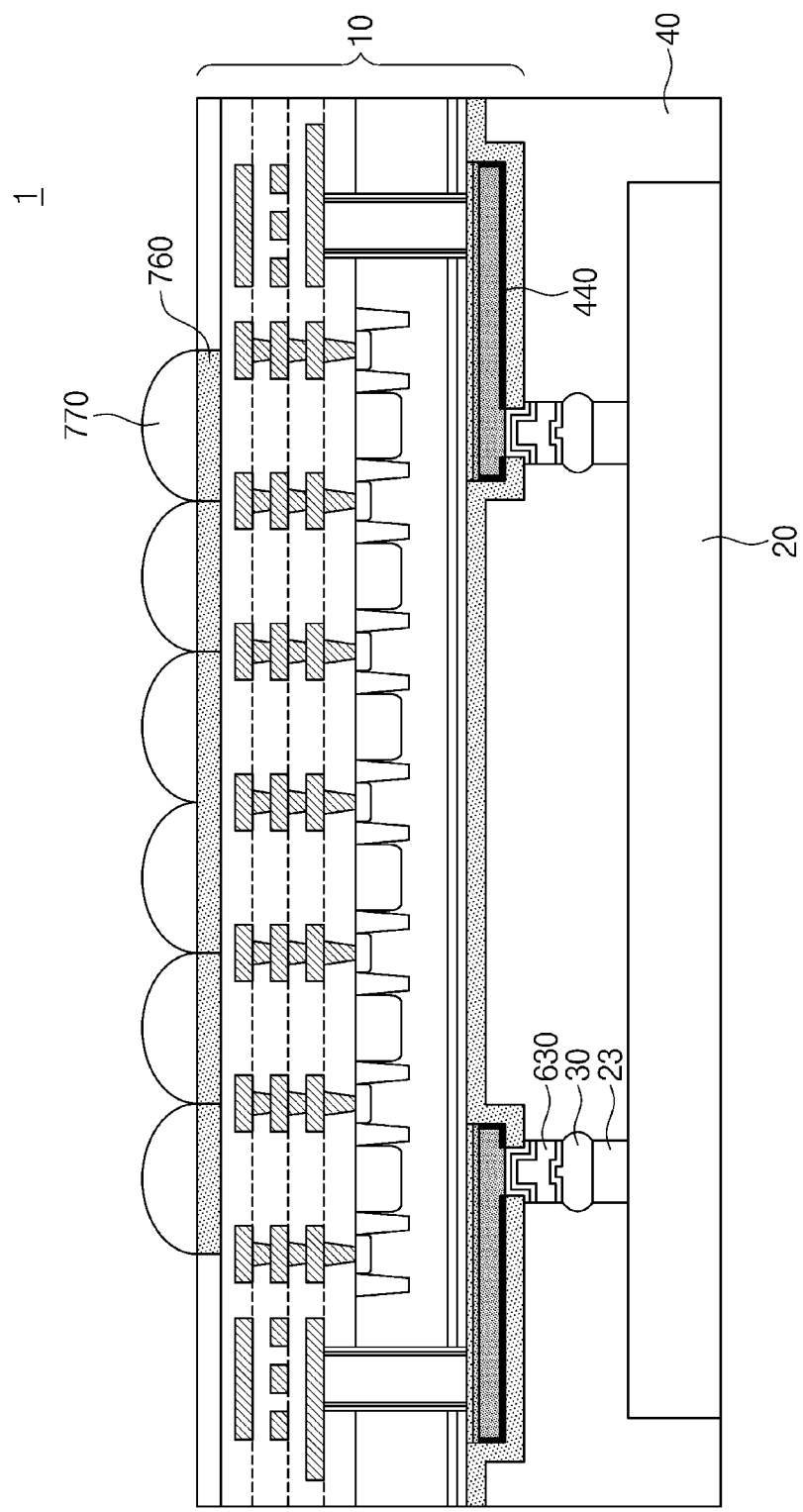
FIG. 1B is a cross-sectional view of a semiconductor package including the semiconductor device of FIG. 1A.

FIG. 1B illustrates an example of a semiconductor package including the semiconductor device of FIG. 1A.

Referring to FIG. 1B, the semiconductor device 10 and an electrical device 20 may be electrically connected to constitute a semiconductor package 1. For example, a solder ball 30 may be formed between the outer terminal 630 of the semiconductor device 10 and an outer terminal 23 of the electrical device 20, and an epoxy molding compound (EMC) may be provided and cured to form a mold layer 40. The electrical device 20 may be or include a memory chip, a logic chip, or a combination thereof. Alternatively, the electrical device 20 may be or include a printed circuit board (PCB). A reflow process for forming the solder ball 30 and a cure process for forming the mold layer 40 may be performed at a temperature ranging from about room temperature (e.g., about 25° C.) to equal to or less than about 250° C.

The semiconductor device 10 may be provided as part of a wafer level process that includes a sawing process. More specifically, a plurality of chip-level electrical devices 20 may be provided on a wafer on which a plurality of the semiconductor devices 10 have been formed, the mold layer 40 may be formed, and then a sawing process may be performed which separates such a structure into individual ones of the semiconductor packages 1. As another example, a wafer on which a plurality of the electrical devices 20 have been formed may be provided on another wafer on which a plurality of the semiconductor devices 10 have been formed, the mold layer 40 is then formed, and then a sawing process may be performed to separate that wafer-on-wafer structure into a plurality of individual semiconductor packages 1.

The oxide layer 440 of the semiconductor device 10 may be subjected to heat produced in one or more thermal processes, e.g., a reflow process and a cure process, that are required to fabricate the semiconductor package 1, thereby continuing to grow. The thermal processes may be performed at a temperature regime of temperatures within a range from about room temperature to equal to or less than about 250° C., and in addition, about several to tens of hours (e.g., less than about 10 hours) may be required from an initial stage of forming the oxide layer 440 to a final stage of fabricating the semiconductor package 1. In this way, the oxide layer 440 may assume a thickness T of about 50 nm to about 200 nm, or more specifically about 100 nm, as discussed above with reference to FIG. 1A.

FIGS. 2A to 2M illustrate a method of manufacturing a semiconductor device, according to the inventive concept.

Figure 2A:
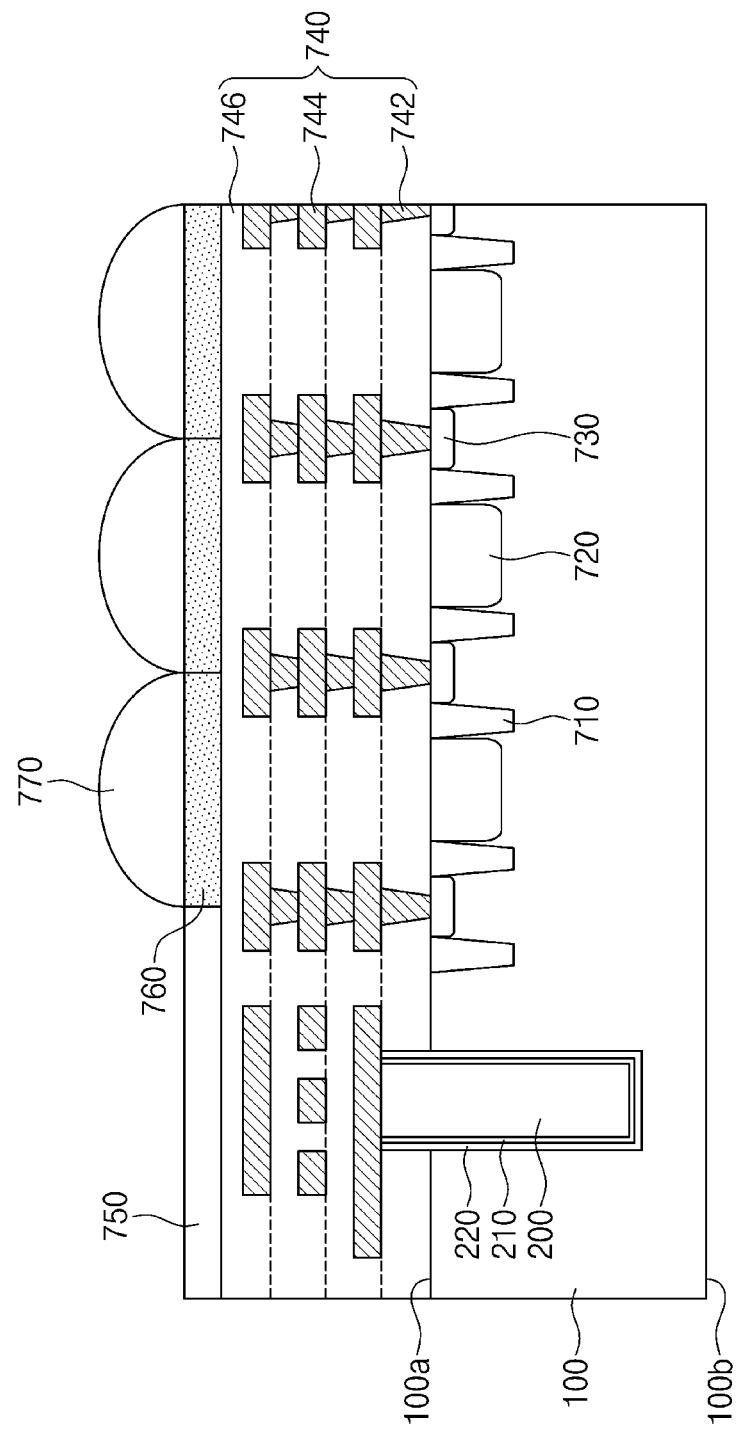
FIGS. 2A, 2B, 2C, 2D, 2E, 2F, 2G, 2H, 2I, 2J, 2K, 2L and 2M are cross-sectional views of a semiconductor device during the course of its manufacture, and together illustrate an example of a method of manufacturing a semiconductor device according to the inventive concept.

Referring to FIG. 2A, a semiconductor substrate 100 as part of a base structure may be provided to have a first surface 100a and a second surface 100b facing in opposite directions. The semiconductor substrate 100 may be or include a semiconductor wafer (e.g., silicon wafer) including a variety of components constituting an image sensor. For example, the semiconductor substrate 100 may include a device isolation layer 710, photodiodes 720, and a plurality of storage nodes 730. The base structure may also include a metal line structure 740, a plurality of color filters 760, and a plurality of micro-lenses 770 on the substrate 100. The color filters 760 and the micro-lenses 770 may be formed of a polymer.

The metal line structure 740 may be formed on the first surface 100a of the semiconductor substrate 100. The forming of the metal line structure 740 may include deposition of an insulating material, such as silicon oxide, and deposition and patterning of a metallic material, such as copper, aluminum, or tungsten. A polymer may be deposited and patterned to form the color filters 760 and the micro-lenses 770 on the metal line structure 740. The other components may be similar to those described above with reference to FIG. 1A.

A through electrode or via 200 may be formed in a blind opening in the semiconductor substrate 100. The through electrode 200 may thus extend into the semiconductor substrate 100 but without reaching the second surface 100b of the semiconductor substrate 100. A barrier layer 210 and a via insulation layer 220 may be formed before the through electrode 200 is formed so as to cover side and bottom surfaces of the through electrode 200. The through electrode 200 may be formed by a plating or deposition process in which a conductive material, such as copper, tungsten, or polysilicon is formed on the barrier layer 210. The barrier layer 210 may be formed by depositing titanium (Ti), titanium nitride (TiN), titanium tungsten (TiW), tantalum (Ta), tantalum nitride (TaN), tungsten nitride (WN), or the like on the insulating layer 220. The via insulation layer 220 may be formed by depositing silicon oxide, silicon nitride, or the like in the blind opening in the semiconductor substrate 100.

Figure 2B:
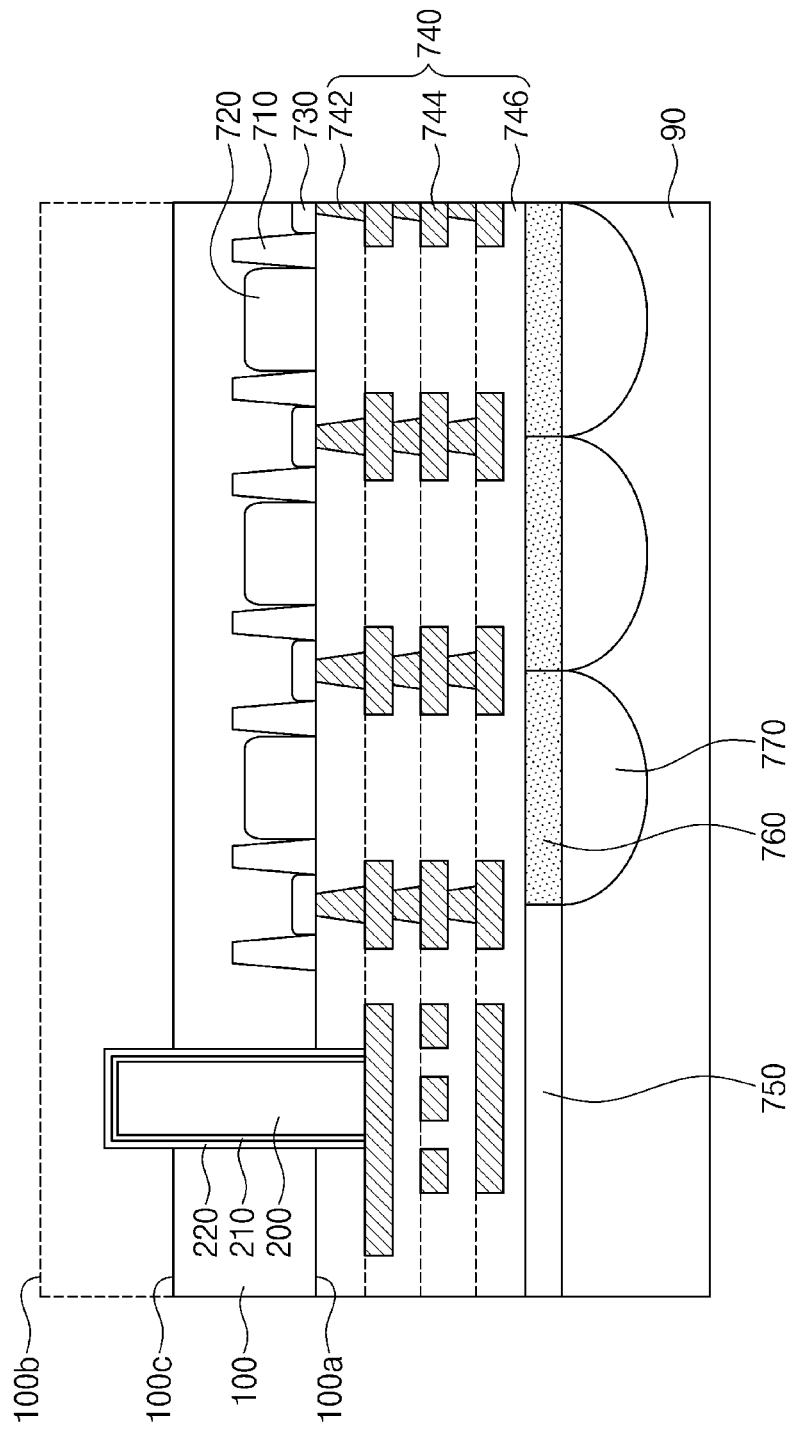

Referring to FIG. 2B, the second surface 100b of the semiconductor substrate 100 may be recessed below the end of the through electrode 200. For example, a carrier 90 may be adhered to the first surface 100a of the semiconductor substrate 100, and the semiconductor substrate 100 may be turned upside down. The carrier 90 may include a semiconductor wafer. An adhesive may be used to adhere the carrier 90 to the semiconductor substrate 100.

The recessing of the second surface 100b may entail grinding, etching, or a combination thereof. The recessing may form a third surface 100c, and cause the through electrode 200 to protrude beyond the third surface 100c. In this description, the first surface 100a may be referred to as a top surface, and the third surface 100c may be referred to as a bottom surface. Unless otherwise stated, the top surface 100a may denote an active surface of the semiconductor substrate 100, and the bottom surface 100c may denote an inactive surface of the semiconductor substrate 100.

Figure 2C:
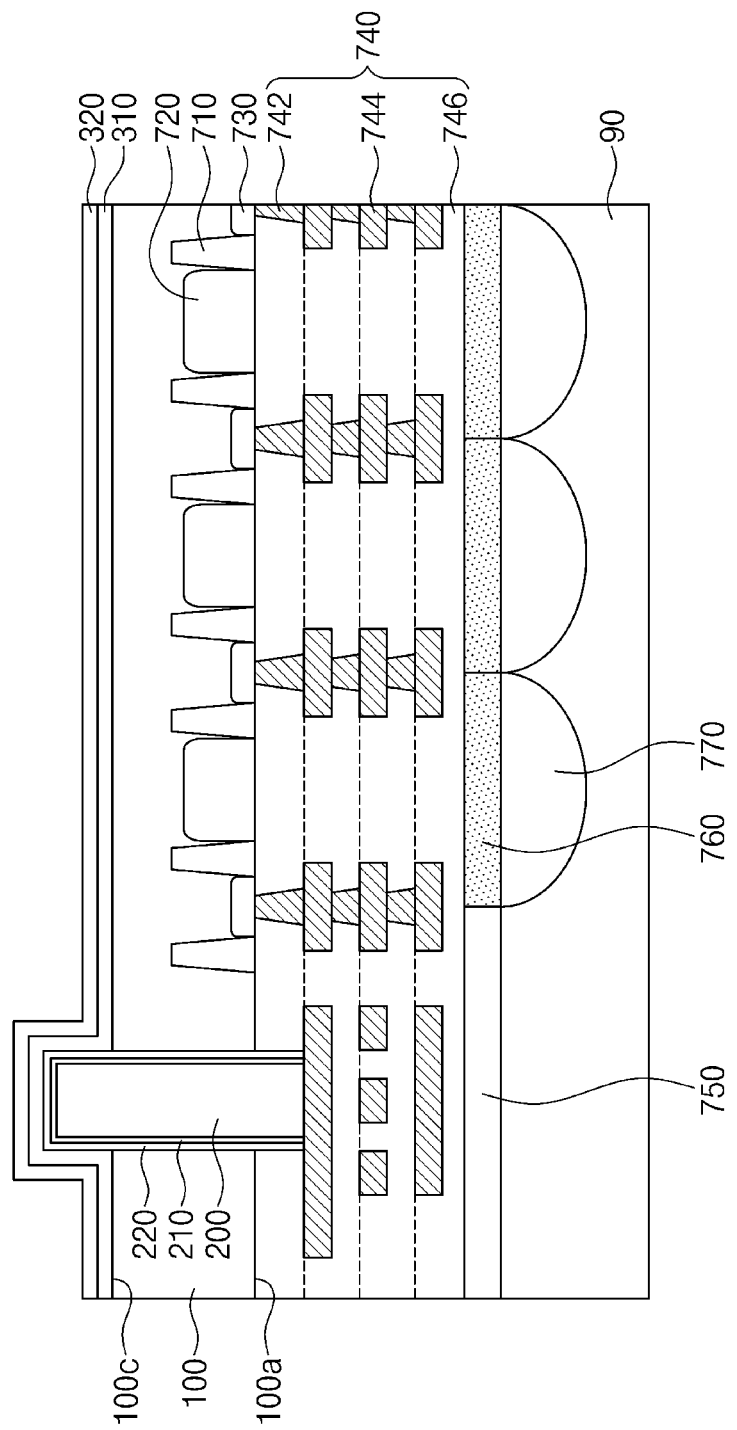

Referring to FIG. 2C, the bottom surface 100c of the semiconductor substrate 100 may be sequentially covered with a first lower insulation layer 310 covering the through electrode 200 and a second lower insulation layer 320 covering the first lower insulation layer 310. The first and second lower insulation layers 310 and 320 may be of different insulating materials from each other. For example, the first lower insulation layer 310 may be formed of silicon oxide, and the second lower insulation layer 320 may be formed of silicon nitride. In other examples, the second lower insulation layer 320 is not formed.

Figure 2D:
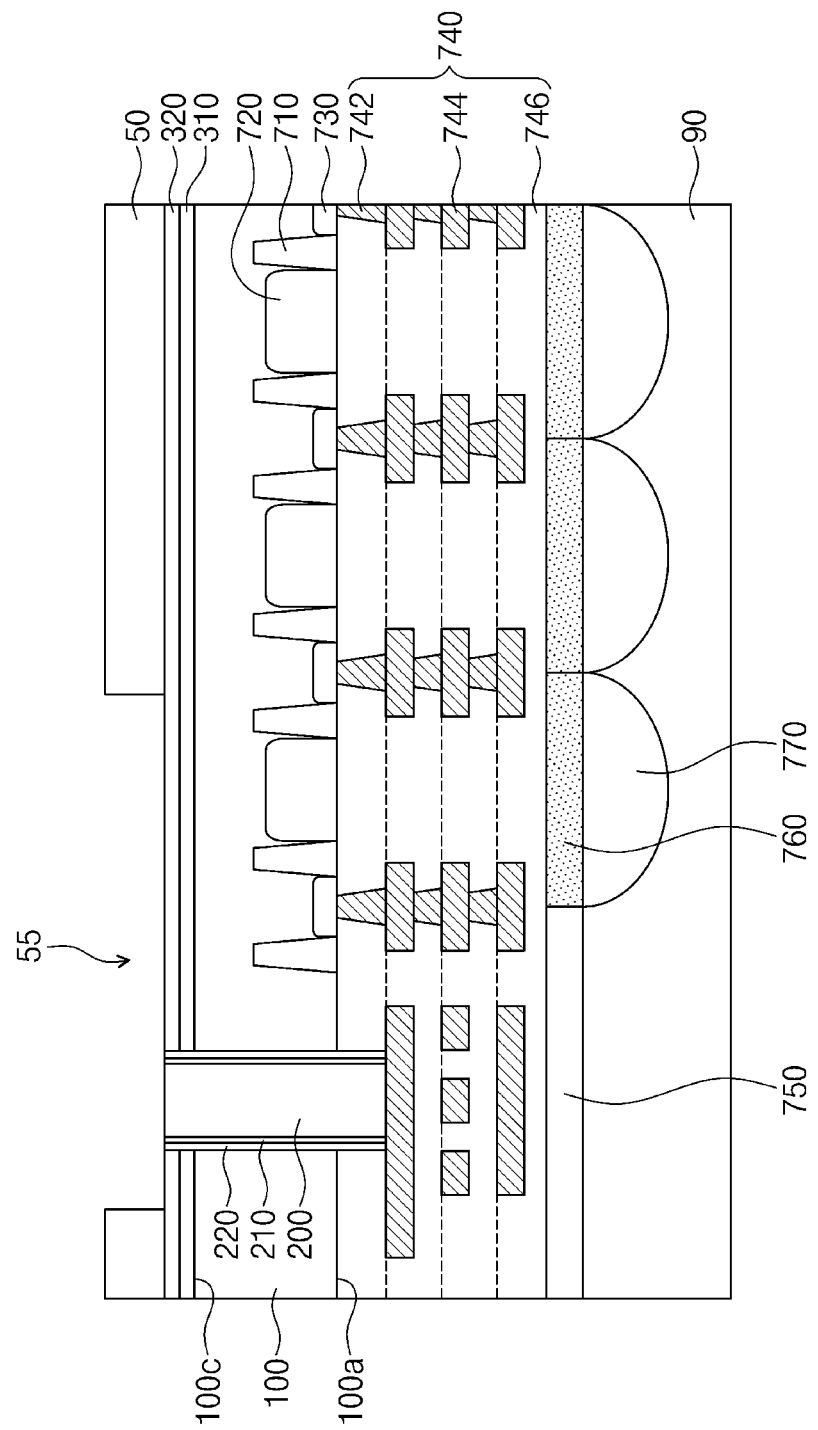

Referring to FIG. 2D, a planarization process, such as chemical mechanical polishing (CMP) or an etch-back process, may be performed to reveal the through electrode 200, following which a mask pattern 50 or "mask" for short may be formed on the bottom surface 100c of the semiconductor substrate 100. The first and second lower insulation layers 310 and 320 may be planarized. The mask pattern 50 may have a groove 55 exposing the through electrode 200. The mask pattern 50 may be formed of an organic material, such as photoresist, or an inorganic material, such as silicon oxide or silicon nitride.

Figure 2E:
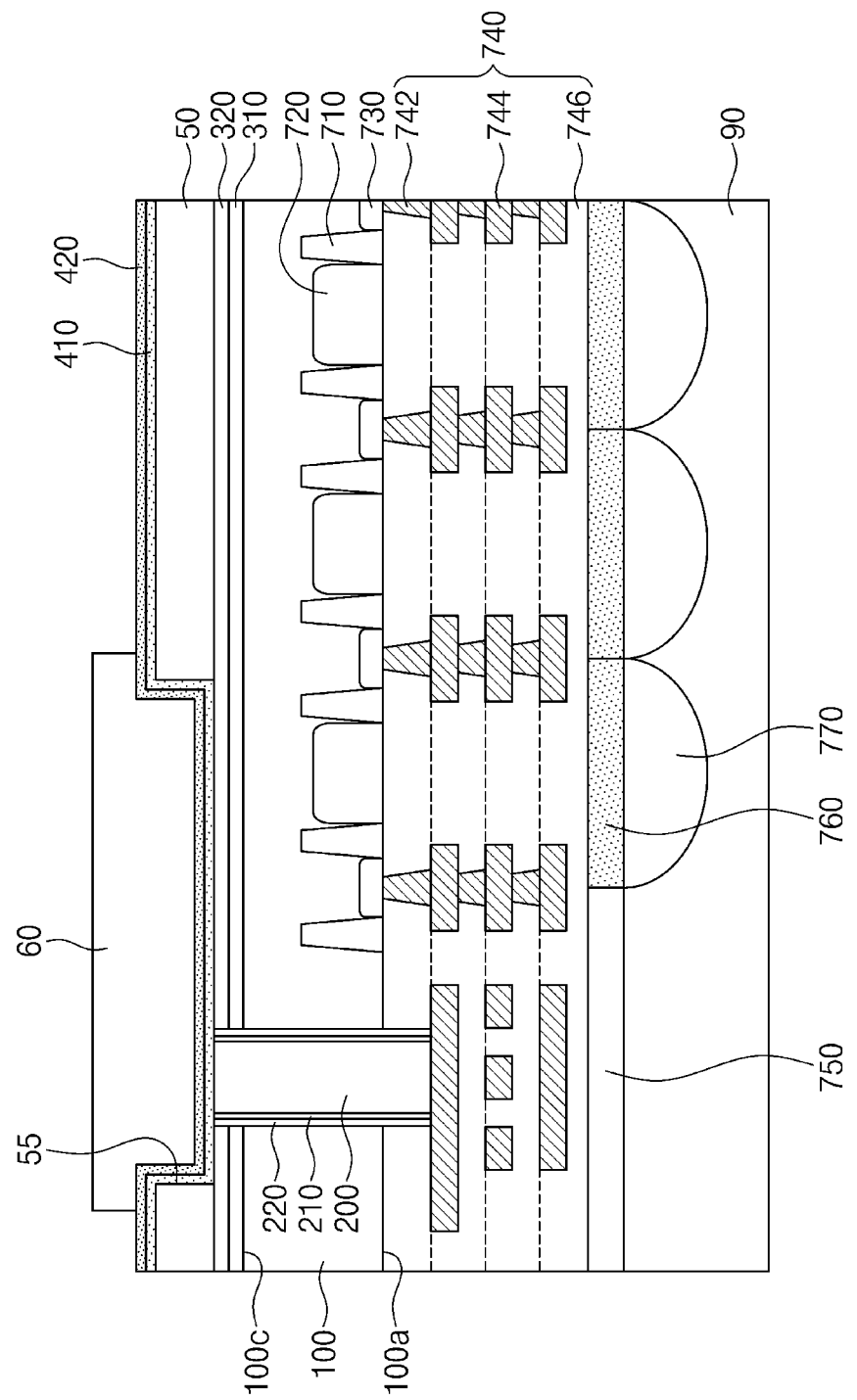

Referring to FIG. 2E, a barrier layer 410, a seed layer 420, and a sacrificial layer 60 may be formed on the bottom surface 100c of the semiconductor substrate 100. The barrier layer 410 may be formed in the groove 55 and on the mask pattern 50, and the seed layer 420 may be formed on the barrier layer 410. The sacrificial layer 60 may fill the groove 55. The barrier layer 410 may be formed of titanium (Ti), titanium nitride (TiN), titanium tungsten (TiW), tantalum (Ta), tantalum nitride (TaN), tungsten nitride (WN), or the like. The seed layer 420 may be formed of copper (Cu), ruthenium (Ru), nickel (Ni), tungsten (W), or the like. The sacrificial layer 60 may be formed of an organic material, such as photoresist, or inorganic material, such as silicon oxide or silicon nitride.

Figure 2F:
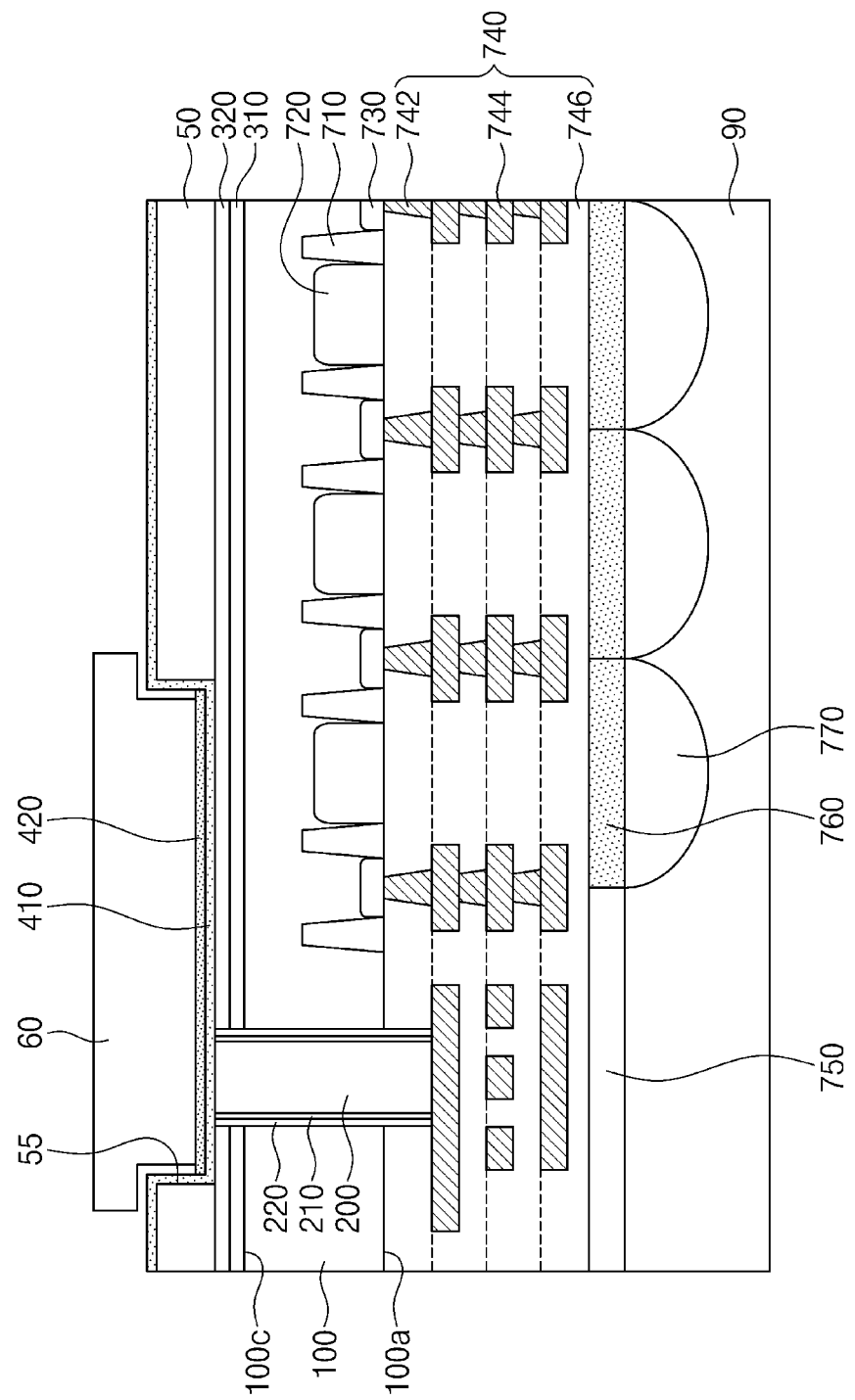

Referring to FIG. 2F, the seed layer 420 may be partially removed. A wet etching process may be employed to partially remove the seed layer 420. The wet etching process may allow the seed layer 420 to remain in the groove 55. The seed layer 420 may then be confined in the groove 55 between the bottom of the sacrificial layer 60 and the barrier layer 410. Alternatively, the seed layer 420 may extend along a side surface of the sacrificial layer 60 in the groove 55 from between the bottom of the sacrificial layer 60 and the barrier layer 410.

Figure 2G:
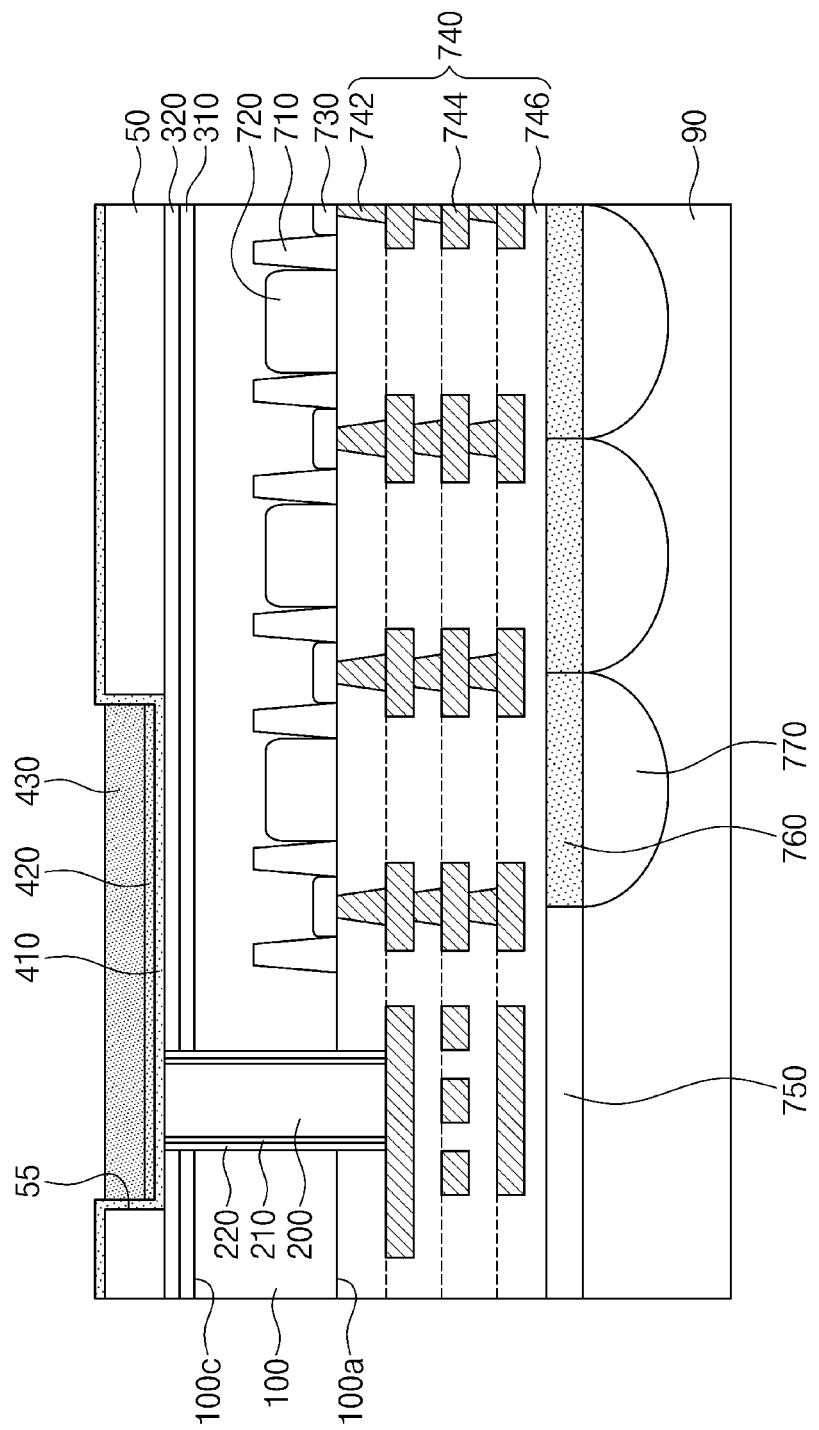

Referring to FIG. 2G, the sacrificial layer 60 may be removed from the groove 55, and a redistribution line 430 may be formed in the groove 55. As the sacrificial layer 60 is removed, the seed layer 420 may be exposed in the groove 55. The exposed seed layer 420 may be used to plate the redistribution line 430 in the groove 55. The redistribution line 430 may be formed of metal, such as copper (Cu). At this time, an interface between the seed layer 420 and the redistribution line 430 may not be visually discernible, i.e., the seed layer 420 may be incorporated into the redistribution line 430. However, for illustrative purposes, the seed layer 420 will continue to be shown in the figures. The redistribution line 430 has a thickness equal to or less than about 15 μm, and preferably from about 10 μm to about 15 μm.

Figure 2H:
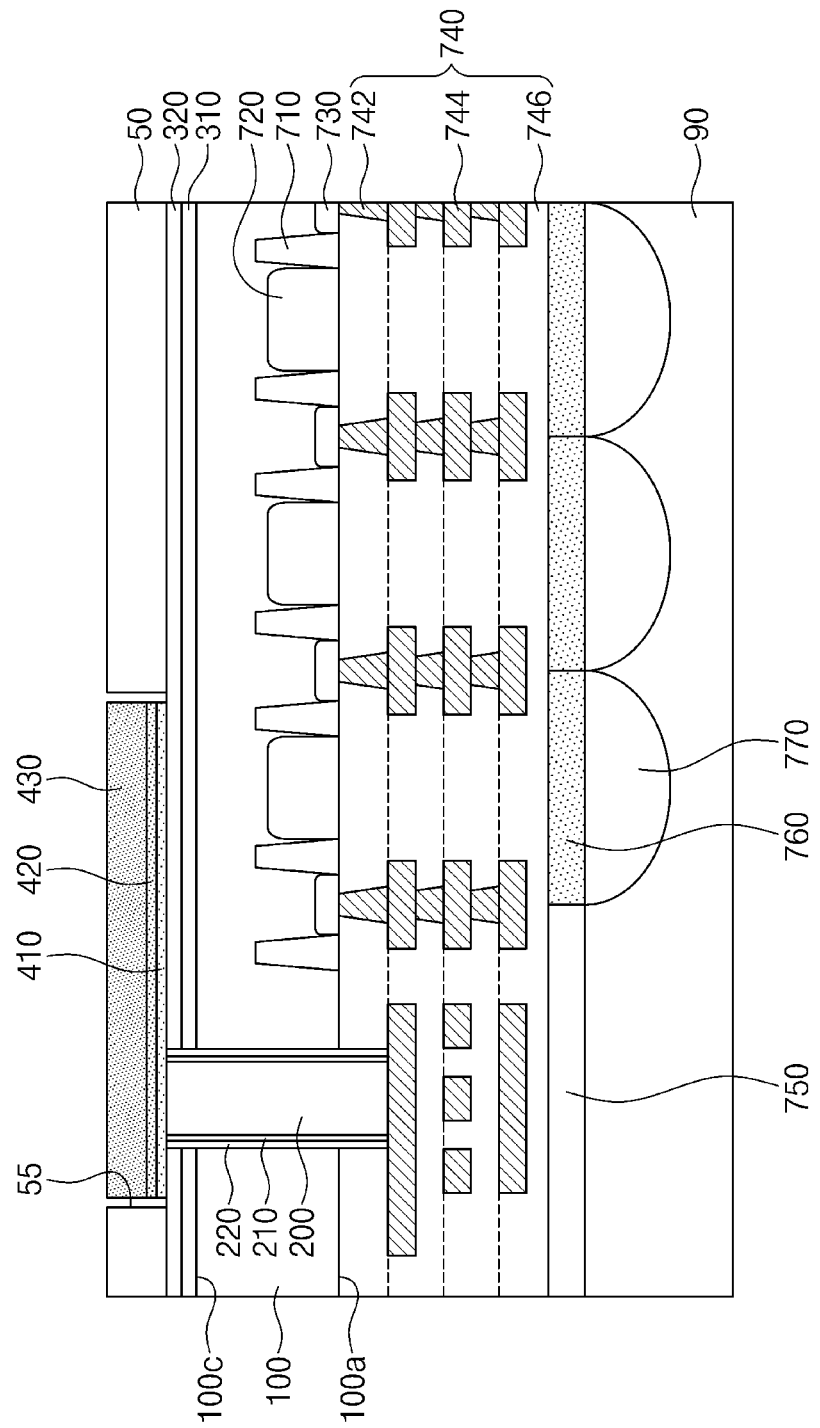

Referring to FIG. 2H, the barrier layer 410 may be partially removed such that a remnant thereof is left in the groove 55. A wet etching process may be employed to partially remove the barrier layer 410. The barrier layer 410 may then be confined in the groove 55 between the seed layer 420 and the second lower insulation layer 320. Alternatively, the barrier layer 410 may be confined in the groove 55 while extending along a side surface of the redistribution line 430 from between the seed layer 420 and the second lower insulation layer 320.

Figure 2I:
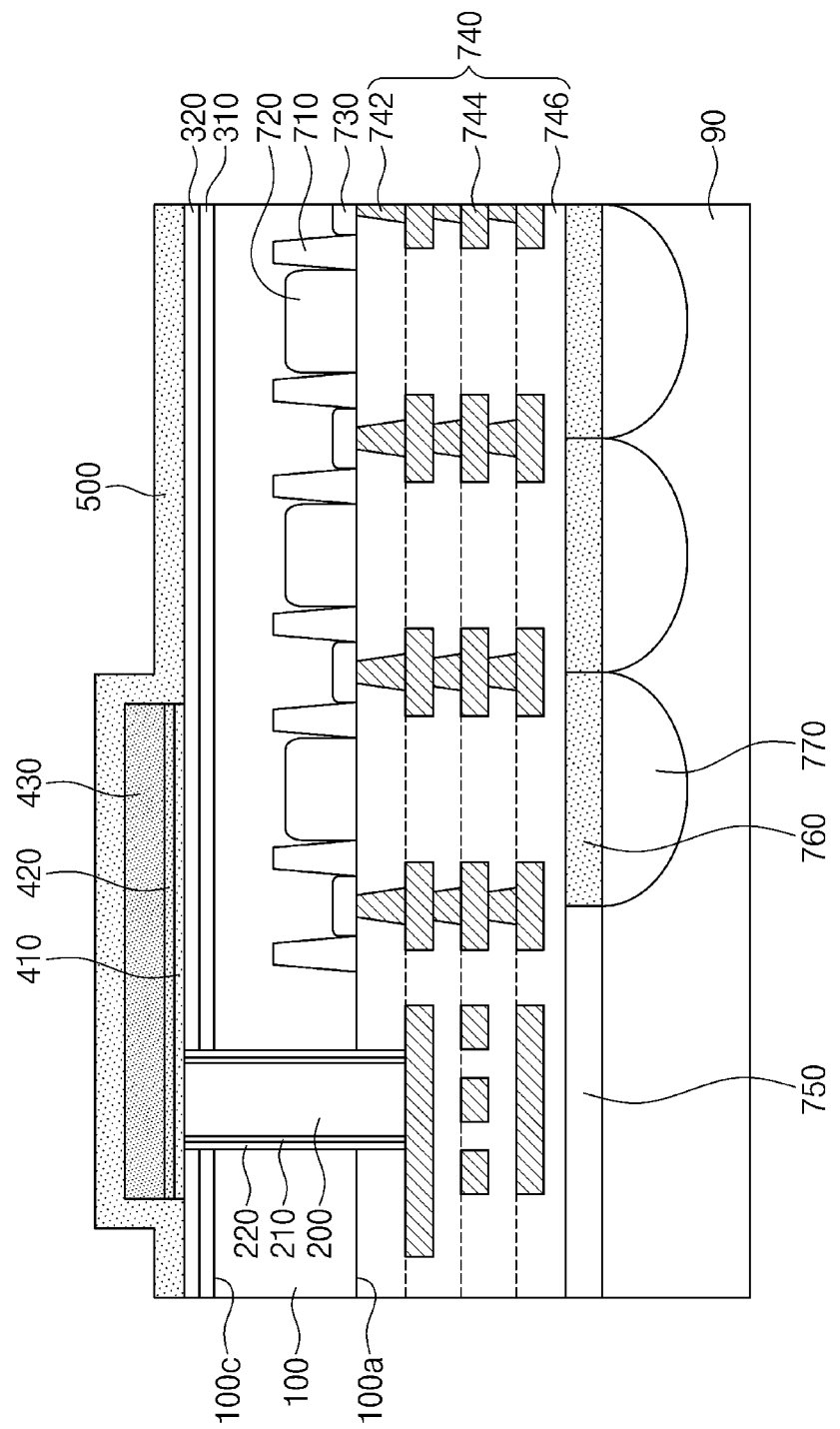

Referring to FIG. 2I, the mask pattern 50 may be removed, and a passivation layer 500 may be formed. The passivation layer 500 may be an inorganic insulation layer, such as silicon oxide or silicon nitride layer, or an organic insulation layer, such as a polyimide (PI) or polybenzoxazole (PBO) layer. For example, polybenzoxazole (PBO) may be provided and cured to form the passivation layer 500. The passivation layer 500 may have a thickness of about 3 μm to about 5 μm.

Figure 2J:
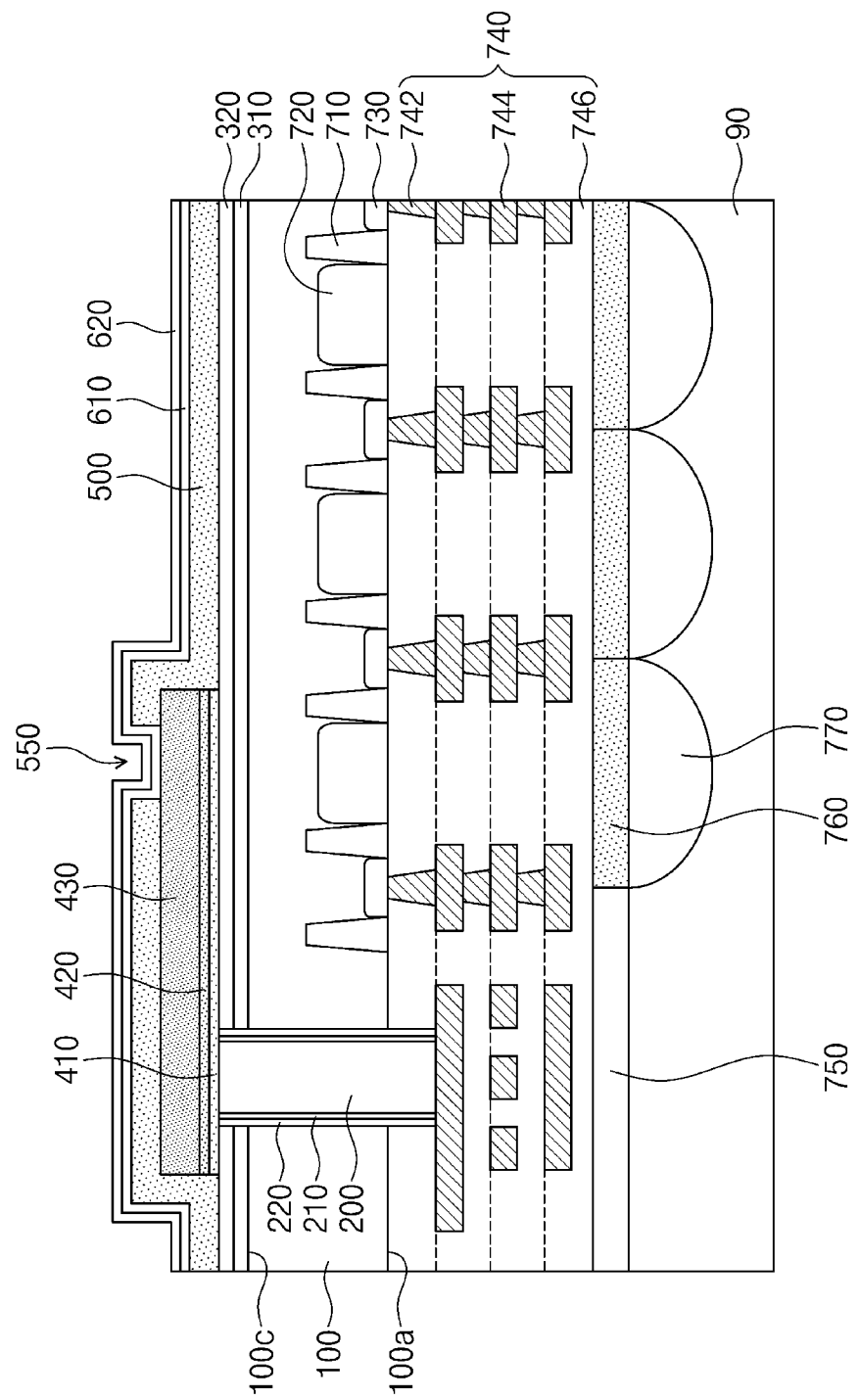

Referring to FIG. 2J, the passivation layer 500 may be patterned to form an opening 550 partially exposing the redistribution line 430, and thereafter, a barrier layer 610 and a seed layer 620 may be sequentially formed on the passivation layer 500. The barrier layer 610 may be in contact with the redistribution line 430 in the opening 550. The barrier layer 610 may be formed of titanium (Ti), titanium nitride (TiN), titanium tungsten (TiW), tantalum (Ta), tantalum nitride (TaN), tungsten nitride (WN), or the like. The seed layer 620 may be formed of copper (Cu), ruthenium (Ru), nickel (Ni), tungsten (W), or the like.

Figure 2K:
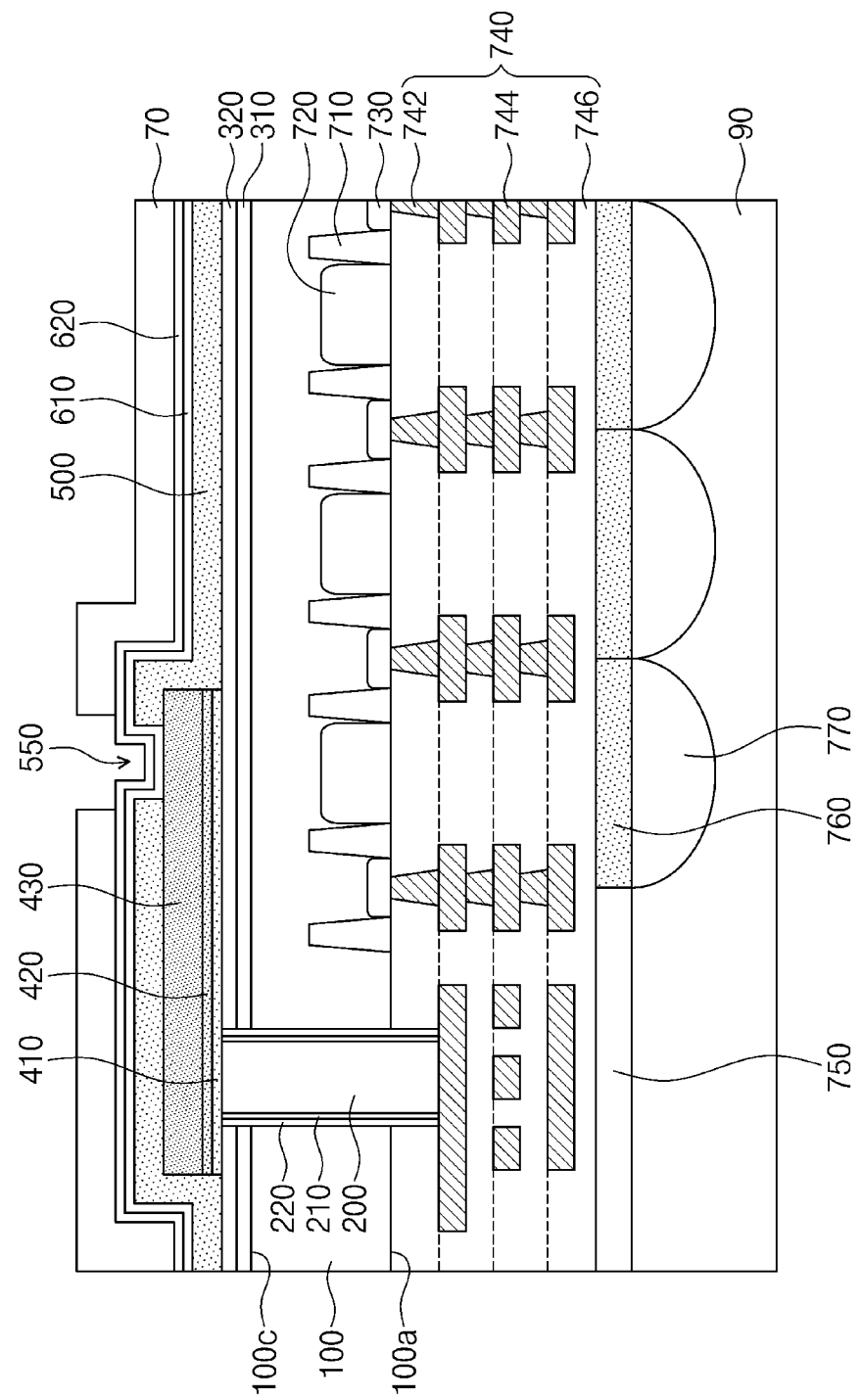

Referring to FIG. 2K, a mask pattern 70 exposing the opening 550 may be formed on the seed layer 620. The mask pattern 70 may be formed of an organic material, such as a photoresist, or an inorganic material, such as silicon oxide or silicon nitride.

Figure 2L:
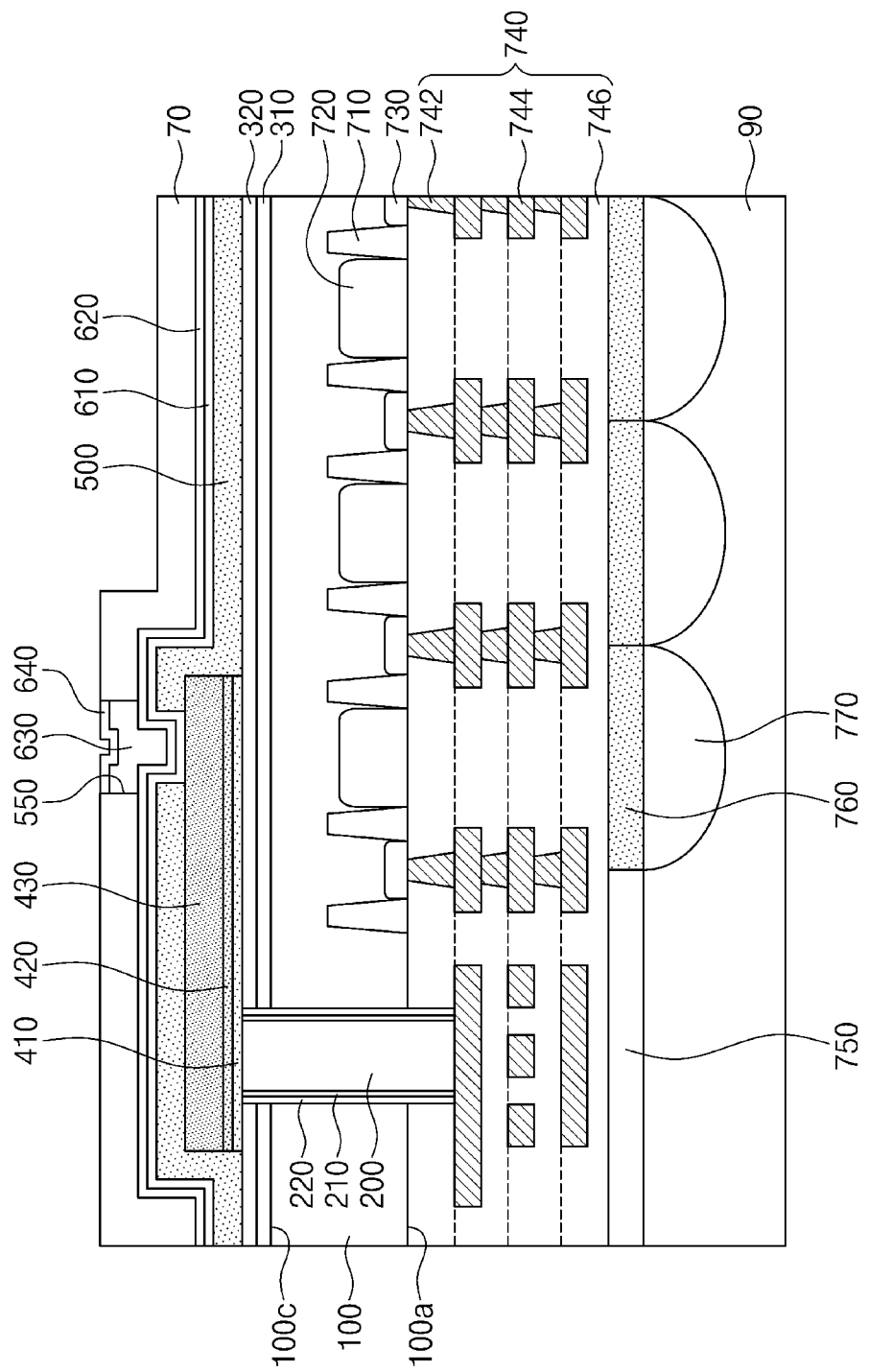

Referring to FIG. 2L, an outer terminal 630 and a capping layer 640 may be formed in the opening 550. The outer terminal 630 may be formed by a plating process using the seed layer 620. The capping layer 640 may be formed by plating metal on the outer terminal 630. The outer terminal 630 may be formed of nickel, tungsten, aluminum, copper, or the like. The capping layer 640 may be formed of gold, nickel, silver, or the like.

Figure 2M:
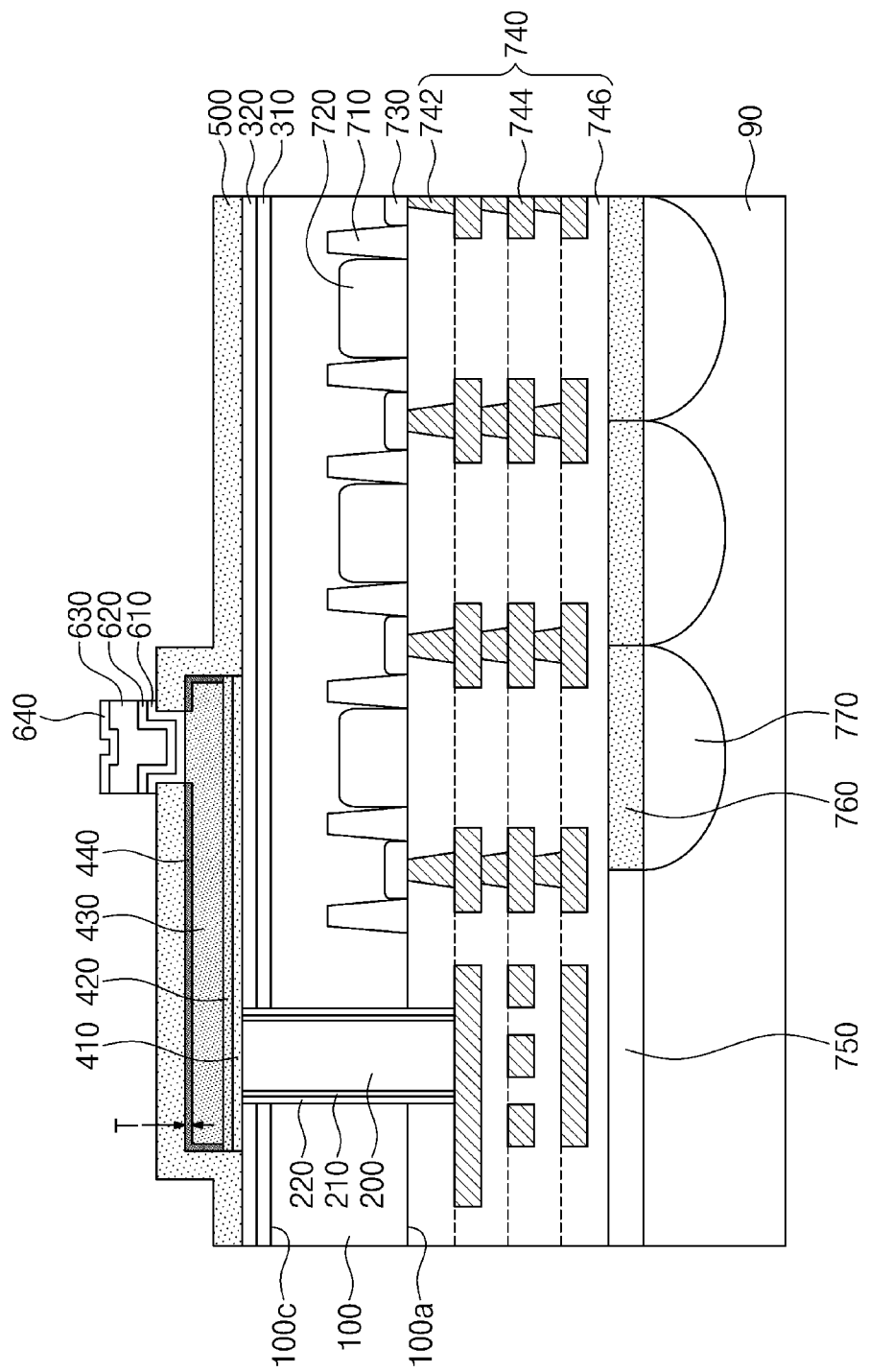

Referring to FIG. 2M, the mask pattern 70 may be removed. A removal process may be performed on the barrier layer 610 and the seed layer 620 that are exposed as a result of the removal of the mask pattern 70. A wet etching process may be employed to remove the barrier layer 610 and the seed layer 620. When the carrier 90 is removed, the semiconductor device 10 of FIG. 1A may be deemed as completed. As illustrated in FIG. 1B, the semiconductor device 10 may be electrically connected through the solder ball 30 to the electrical device 20, and encapsulated by the mold layer 40, which process may complete the fabricating of the semiconductor package 1.

According to some examples of inventive concept, after the forming of the passivation layer 500 discussed above with reference to FIG. 2J, subsequent processes, for example, a deposition process, a plating process, a reflow process, and a cure process, may provide heat by which an oxide layer 440 may be formed between the redistribution line 430 and the passivation layer 500. For example, during the subsequent processes, heat required for the subsequent processes (i.e., the thermal regime of the subsequent processes) may cause oxygen in the passivation layer 500 to react with a constituent (e.g., copper) of the redistribution line 430. This reaction may form and grow a native metal oxide layer, or the oxide layer 440. Note, therefore, although the oxide layer 440 is only shown in FIG. 2M (as grown to its full thickness), the oxide layer is formed prior to this stage but any beginning of the oxide layer is omitted in the figures, for example, in any of FIGS. 2G-2L.

The subsequent processes may be performed at relatively low temperature regime within a range from room temperature (e.g., about 25° C.) to about 250° C., and which temperatures are selected to be below the temperature ratings of heat-vulnerable components such as the color filters 760 and/or the micro-lenses 770 formed of a polymer so to thermal damage to these components is avoided. The thickness T of the oxide layer 440 may depend not only on heat but also on process time. The semiconductor device 10 or the semiconductor package 1 is designed so that after the passivation layer 500 is formed, a process time of only several to tens of hours, and preferably less than about 10 hours, is required to complete its fabrication. Here, the time at which the fabrication is completed may coincide with the termination of the last process in which significant heat is generated, e.g., the last process in which temperature is part of the process recipe.

As discussed above with reference to FIG. 1A, the oxide layer 400 may serve as a barrier that prevents migration of a constituent (e.g., copper) of the redistribution line 430. When the thickness T of the oxide layer 440 is less than about 50 nm or greater than about 200 nm, the oxide layer 440 will not act as a sufficient barrier electrochemical migration or tends to crack. According to the inventive concept, the low temperature condition and/or the short process time causes the oxide layer 440 to form to a thickness T ranging from about 50 nm to about 200 nm, and preferably about 100 nm. An oxide layer 440 having such a thickness T will not adversely affect electrical characteristics of the semiconductor device 10 and/or of the semiconductor package 1.

Referring back to FIG. 1A, the redistribution line 430 may be surrounded by the barrier layer 410 and the oxide layer 440. When viewed in cross-section, the barrier layer 410 may have a linear shape covering a top surface of the redistribution line 430, and the oxide layer 440 may have a bracket shape covering bottom and side surfaces of the redistribution line 430. The top surface of the redistribution line 430 may face the bottom surface 100c of the semiconductor substrate 100, and the bottom surface of the redistribution line 430 may be opposite to the top surface of the redistribution line 430.

FIGS. 3A to 3D illustrate another example of a method of manufacturing a semiconductor device, according to the inventive concept.

Figure 3A:
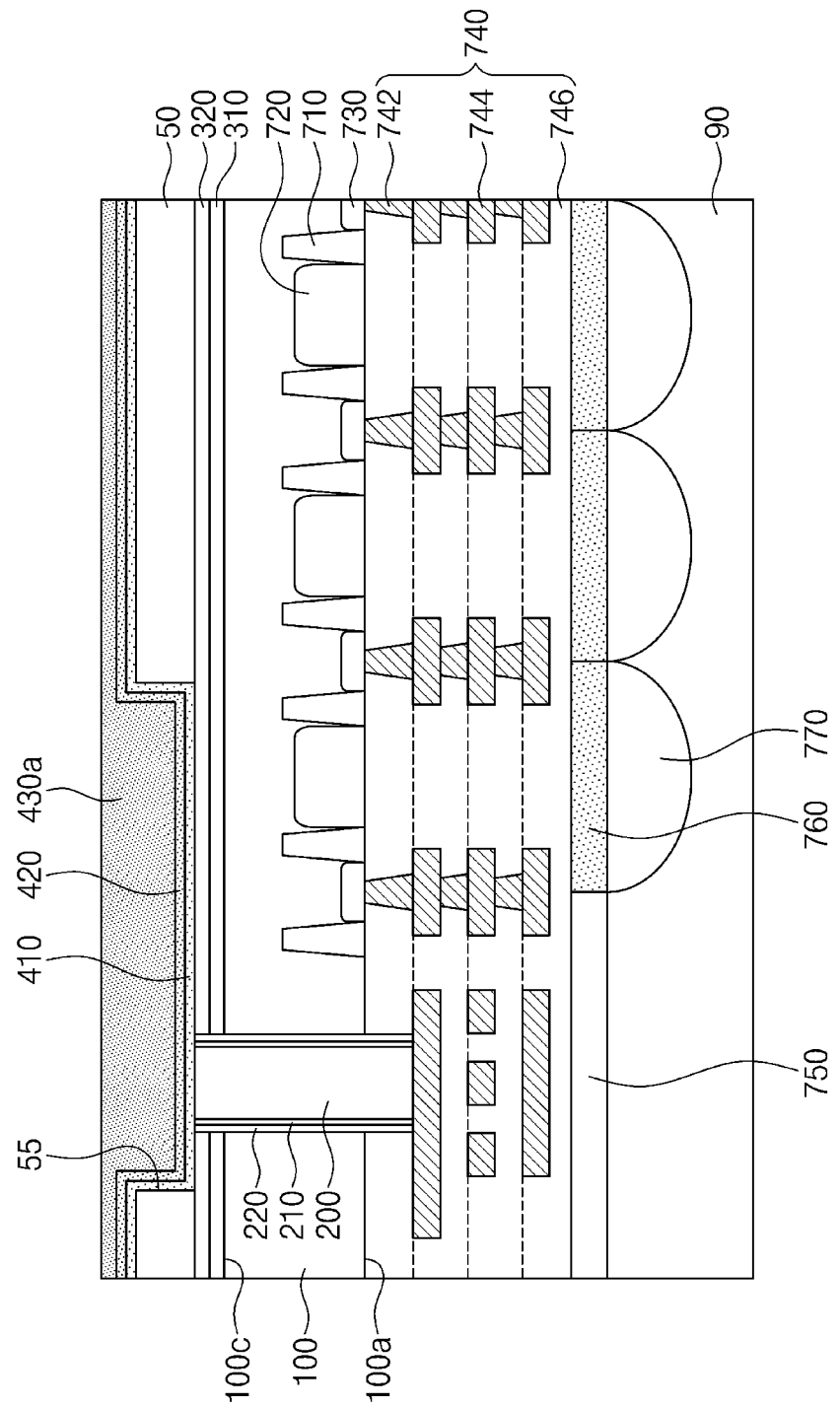
FIGS. 3A, 3B, 3C and 3D are cross-sectional views of a semiconductor device during the course of its manufacture, and together illustrate another example of a method of manufacturing a semiconductor device according to the inventive concept.

Referring to FIG. 3A, processes identical or similar to those discussed above with reference to FIGS. 2A to 2E may be performed to form the barrier layer 410 and the seed layer 420 on the bottom surface 100c of the semiconductor substrate 100. Instead of the sacrificial layer 60 of FIG. 2E, a metal layer 430a is formed to fill the groove 55. The metal layer 430a may be formed by plating metal, such as copper.

Figure 3B:
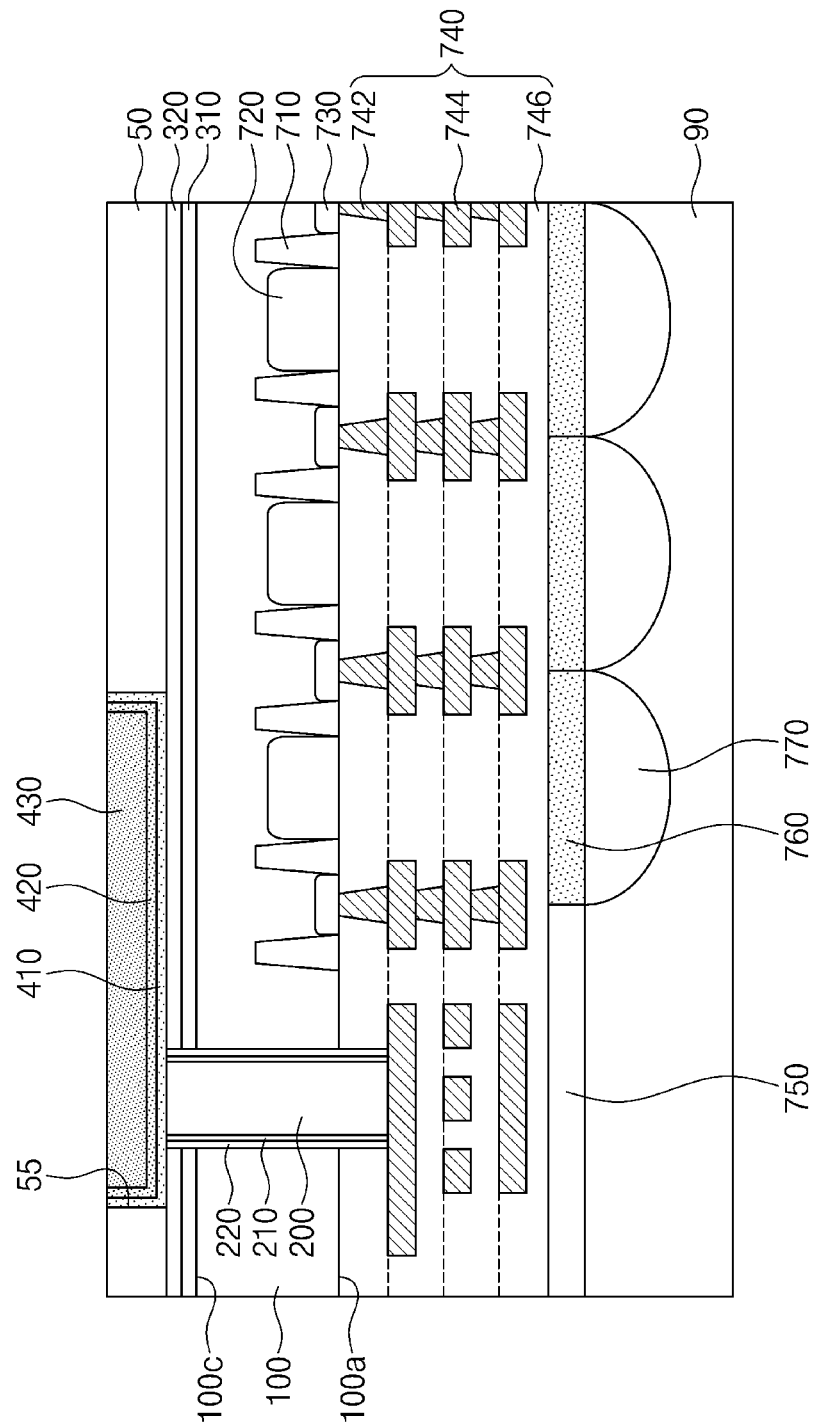

Referring to FIG. 3B, the metal layer 430a may be planarized by a planarization process, such as chemical mechanical polishing (CMP) or an etch-back process. The planarization process may form the redistribution line 430 in the groove 55. The planarization process may continue until the mask pattern 50 is exposed.

Figure 3C:
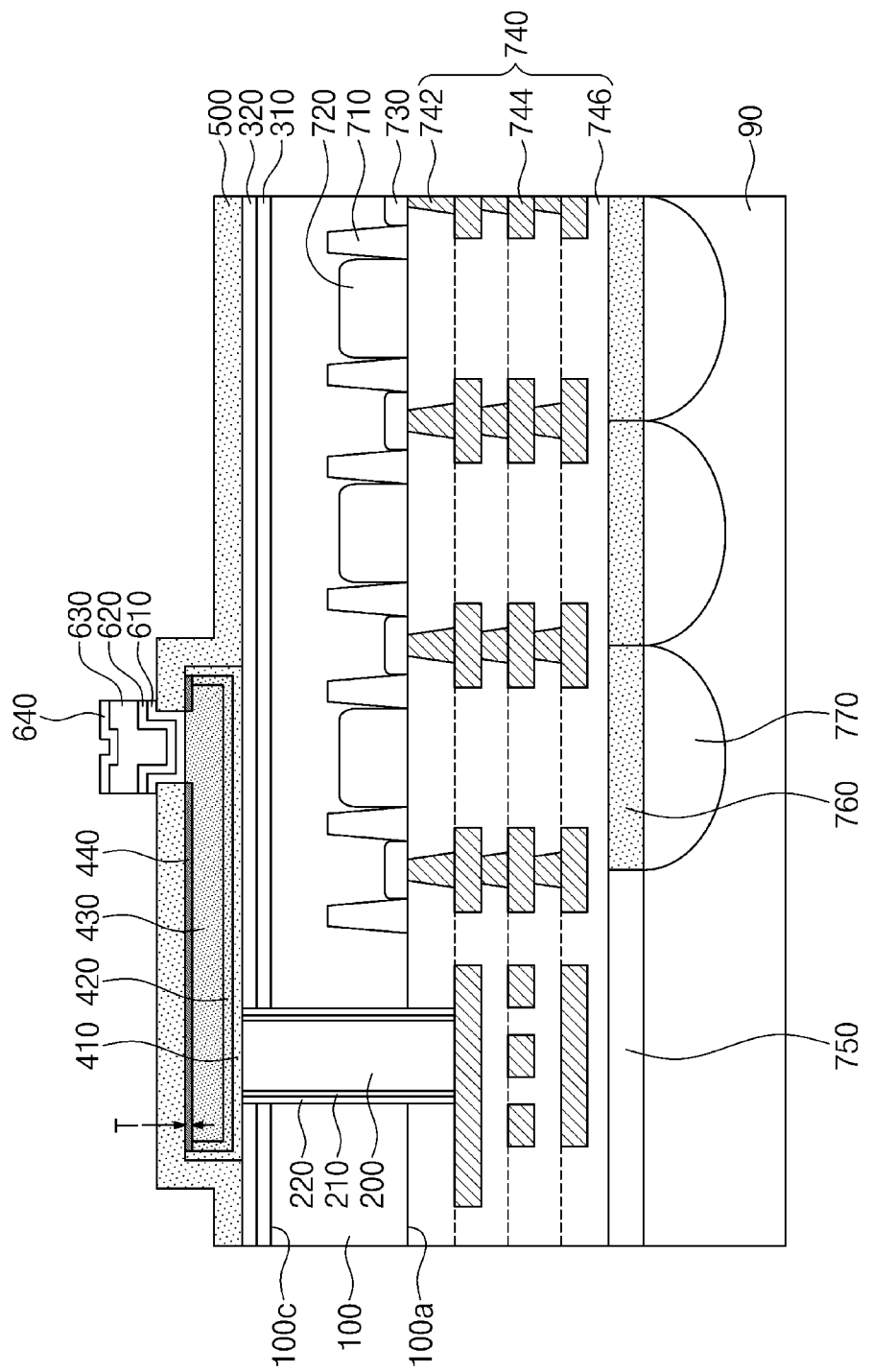

Referring to FIG. 3C, processes identical or similar to those discussed above with reference to FIGS. 2I to 2M may be performed to form the passivation layer 500 covering the redistribution line 430 on the bottom surface 100c of the semiconductor substrate 100 and to form the outer terminal 630 coupled to the redistribution line 430.

Figure 3D:
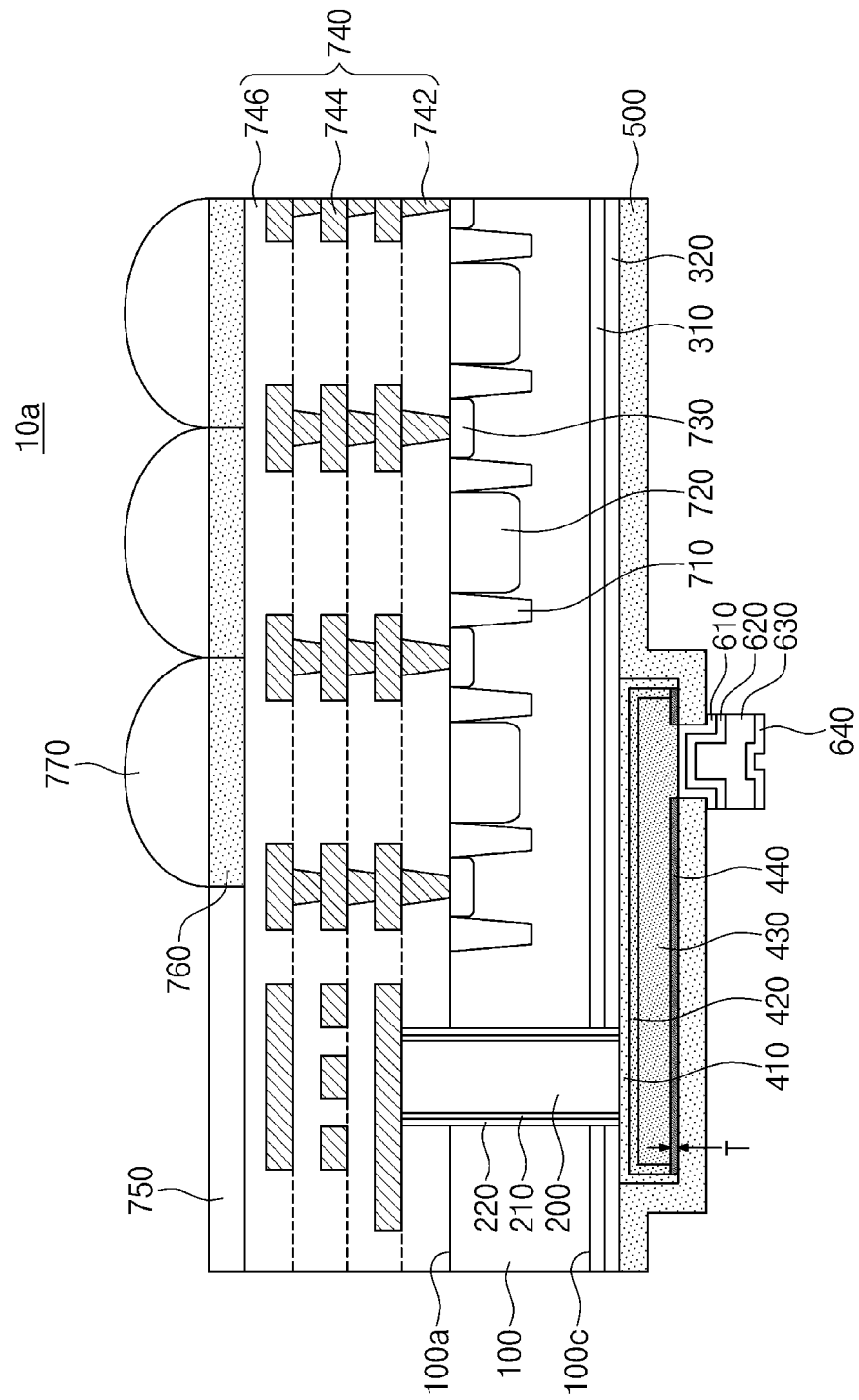

Referring to FIG. 3D, when the carrier 90 is removed, a semiconductor device 10a may be fabricated. Similar to the semiconductor device 10 of FIG. 1A, the oxide layer 440 of the semiconductor device 10a has a thickness T ranging from about 50 nm to about 200 nm, and preferably about 100 nm. When viewed in cross-section, the oxide layer 440 may have a linear shape covering the bottom surface of the redistribution line 430, and the barrier layer 410 may have a bracket shape covering the top and side surfaces of the redistribution line 430.

According to inventive concepts, the oxide layer on the redistribution line can prevent migration of a constituent of the redistribution line, and have a thickness resistant to crack initiation and propagation. Accordingly, the present inventive concept can provide a highly reliable redistribution line and/or a semiconductor device including the redistribution line.

Finally, this detailed description of the inventive concept should not be construed as limited to the examples set forth herein. Rather, the inventive concept may be applied to various combinations, modifications and variations of the examples without departing from the spirit and scope of inventive concept as defined by the appended claims.

What is claimed is:

1. A method of manufacturing a semiconductor device, the method comprising:
providing a base structure including a semiconductor substrate having a top surface and a bottom surface opposite to the top surface, and a color filter and a micro-lens on the top surface of the semiconductor substrate;
forming a redistribution line on the bottom surface of the semiconductor substrate;
forming a passivation layer covering the redistribution line on the bottom surface of the semiconductor substrate; and
spontaneously forming an oxide layer on the redistribution line and growing the oxide layer between the redistribution line and the passivation layer at a temperature regime specified to avoid thermal damage to the color filter and the micro-lens.

2. The method of claim 1, wherein the passivation layer is formed of material comprising oxygen, and the oxygen in the passivation layer and a constituent of material of the redistribution line react to form the oxide layer.

3. The method of claim 1, wherein the growing of the oxide layer automatically occurs during processes carried out subsequent to the forming of the passivation layer such that a thickness of the oxide layer is in a range of from 50 nm to 200 nm at a time at which the manufacturing of the semiconductor device has been completed.

4. The method of claim 1, wherein the oxide layer automatically is grown automatically to have a thickness of about 100 nm a time at which the manufacturing of the semiconductor device has been completed.

5. The method of claim 1, wherein the temperature regime has a maximum temperature of 250° C.

6. The method of claim 1, wherein forming the redistribution line comprises:
forming a mask pattern on the bottom surface of the semiconductor substrate;
sequentially forming a barrier layer and a seed layer on a surface of the semiconductor substrate exposed by the mask pattern; and
forming a metal layer by a plating process using the seed layer.

7. The method of claim 6, wherein the base structure comprises a through electrode that penetrates the semiconductor substrate and is exposed at the bottom surface of the semiconductor substrate, and
the barrier layer is formed as coupled to the through electrode.

8. The method of claim 6, wherein the redistribution line has a top surface facing the bottom surface of the semiconductor substrate, a bottom surface facing away from the semiconductor substrate, and a side surface, the side surface connecting the top surface and the bottom surface of the redistribution line to each other,
the barrier layer is formed to cover the top surface of the redistribution line, and
the oxide layer covers the bottom surface and the side surface of the redistribution line.

9. The method of claim 1, wherein the forming of the passivation layer comprises forming a layer of polybenzoxazole (PBO) on the redistribution line and along the bottom surface of the semiconductor substrate not covered by the redistribution line.

10. A method of manufacturing a semiconductor device, the method comprising:
providing a base structure including semiconductor substrate having an active surface and an inactive surface opposite to the active surface, and a color filter and a micro-lens on the active surface;
forming a redistribution metal layer on the inactive surface of the semiconductor substrate;
forming on the inactive surface of the semiconductor substrate an organic insulation layer covering the redistribution metal layer; and
growing a metal oxide layer to a predetermined thickness between the redistribution metal layer and the organic insulation layer,
wherein the metal oxide layer is grown to said predetermined thickness during processing carried out subsequent to the forming of the organic insulation layer within a temperature regime specified to avoid thermal damage to the color filter and the micro-lens.

11. The method of claim 10, wherein the metal oxide layer is formed by a spontaneous reaction between the redistribution metal layer and the organic insulation layer.

12. The method of claim 10, wherein temperature regime has a maximum temperature of 250° C.

13. The method of claim 10, wherein said predetermined thickness is in a range of from 50 nm to 200 nm.

14. The method of claim 10, wherein the providing of the base structure comprises:
forming a through electrode through the semiconductor substrate; and
thinning the semiconductor substrate to reveal the inactive surface, wherein the through electrode is exposed at the inactive surface of the semiconductor substrate.

15. The method of claim 14, wherein the forming of the redistribution metal layer comprises:
forming on the inactive surface of the semiconductor substrate a mask having a groove that exposes the through electrode;
forming on the inactive surface of the semiconductor substrate a barrier layer coupled to the through electrode;
forming a seed layer on the barrier layer; and
performing a plating process using the seed layer to form in the groove a metal layer comprising copper (Cu).

16. The method of claim 15, wherein the forming of the organic insulation layer comprises:
providing polybenzoxazole (PBO) on the copper (Cu); and
curing the polybenzoxazole (PBO).

17. The method of claim 10, wherein the providing of the base structure comprises forming a metal line structure on the active surface of the semiconductor substrate, wherein the color filter and the micro-lens are stacked on the metal line structure; and
further comprising forming an outer terminal that extends through the organic insulation layer to the redistribution metal layer.

18. A method of forming a redistribution line, the method comprising:
providing a base structure including a semiconductor substrate having an active surface and an inactive surface, and a through electrode that does not reach the inactive surface;
recessing the inactive surface of the semiconductor substrate to expose the through electrode;
subsequently forming the redistribution line on the inactive surface of the semiconductor substrate, the redistribution line electrically connected to the through electrode; and
forming an organic passivation layer covering the redistribution line; and
growing, at a temperature equal to or less than 250° C., a native metal oxide layer between the redistribution line and the organic passivation layer to a thickness in a range of from 50 nm to 200 nm.

19. The method of claim 18, wherein the redistribution line comprises copper (Cu), and the organic passivation layer comprises polybenzoxazole (PBO).

20. The method of claim 18, wherein the recessing of the inactive surface of the semiconductor substrate comprises:
adhering a carrier to the active surface of the semiconductor substrate; and
grinding the semiconductor substrate having the carrier adhered thereto.

21. The method of claim 18, further comprising forming on the inactive surface of the semiconductor substrate, after the inactive surface has been recessed, an insulation layer covering the through electrode, and
planarizing the insulation layer to form a planarized structure in which the through electrode appears at a surface of the insulation layer,
wherein the redistribution line is formed as electrically connected to the through electrode of the planarized structure.

22. The method of claim 21, wherein the forming of the redistribution line comprises:
forming on the surface of the insulation layer a mask pattern including a groove exposing the through electrode that appears at the surface of the planarized insulation layer,
sequentially forming a barrier layer and a seed layer on a resultant structure including the mask pattern; and
performing a plating process using the seed layer to form in the groove a metal layer comprising copper (Cu).

23. The method of claim 18, wherein, after the organic passivation layer has been formed formed, the native metal oxide layer is formed over a course of 10 hours to a thickness of 100 nm.

* * * * *